(12) United States Patent
Lai

(10) Patent No.: US 8,088,636 B2
(45) Date of Patent: Jan. 3, 2012

(54) LED PACKAGING USING INJECTION MOLDING METHOD

(75) Inventor: Kuang-Chu Lai, Shulin (TW)

(73) Assignee: Liang Meng Plastic Share Co., Ltd., Taipei (TW)

( * ) Notice: Subject to any disclaimer, the term of this patent is extended or adjusted under 35 U.S.C. 154(b) by 0 days.

(21) Appl. No.: 12/947,850

(22) Filed: Nov. 17, 2010

(65) Prior Publication Data
US 2011/0189800 A1 Aug. 4, 2011

(30) Foreign Application Priority Data
Feb. 3, 2010 (TW) ................................ 99103139 A

(51) Int. Cl.
*H01L 21/00* (2006.01)
(52) U.S. Cl. .............. 438/27; 438/28; 438/34; 438/116; 438/127; 257/E33.059
(58) Field of Classification Search .............. 438/26–28, 438/34, 38, 116, 127; 257/E33.056–E33.059
See application file for complete search history.

(56) References Cited

U.S. PATENT DOCUMENTS
6,137,224 A * 10/2000 Centofante .................... 313/510
2003/0057421 A1* 3/2003 Chen .............................. 257/79
* cited by examiner

*Primary Examiner* — Kevin Parendo
(74) *Attorney, Agent, or Firm* — Chun-Ming Shih; HDLS IPR Services

(57) ABSTRACT

A light emitting diode (LED) packaging method includes the steps of preparing a circuit board (1), a transparent cap (3), and at least one LED material (2), placing the transparent cap (3) on the LED material (2) such that the circuit board (1) is aligned and superimposed, and forming an encapsulation layer (4) having a light pattern on the transparent cap (3) by an in-mold decoration injection molding process. In the in-mold decoration injection molding process, a filling port (511) of a mold (5) is aligned precisely above the LED material (2) to prevent a deviation of the LED material (2) and omit a surface mount technology (SMT) process, so as to integrally form an LED with a light pattern at the same time and achieve good water-resisting and static charge resisting effects.

6 Claims, 7 Drawing Sheets

LED PACKAGING USING INJECTION MOLDING METHOD

FIELD OF THE INVENTION

The present invention generally relates to a light emitting diode (LED) die packaging process, in particular to a method of packaging an LED.

BACKGROUND OF THE INVENTION

LED has been used extensively in illumination and light emitting display fields and the packaging process of forming a secondary lens with a light pattern onto an LED die or forming a secondary lens onto an LED die usually has concerns on its low yield rate since an injection of plastic materials may cause a deviation of the LED die, and the electric contact may be affected adversely. Therefore, the LED dies are generally soldered onto a circuit board by a surface mount technology (SMT) process before the packaging process takes place. However, such manufacturing process involves too many complicated steps, and incurs increased manufacturing time and material cost.

In view of the foregoing shortcoming of the conventional packaging method, the inventor of the present invention conducted extensive researches and experiments, and finally developed a feasible design to overcome the aforementioned shortcoming of the prior art.

SUMMARY OF THE INVENTION

Therefore, it is a primary objective of the present invention to provide an LED packaging method, wherein an LED die is fixed on a circuit board or an LED is covered by a primary lens through a transparent cap, and then an in-mold decoration injection molding process is performed to assure that the transparent cap will not be deviated from the LED or the LED die. In the meantime, a filling port of a mold used in the in-mold decoration injection molding process is aligned precisely above the LED or the LED die to prevent the deviation of LED or the LED die due to a pushing force produced in the process of filling plastic materials in different direction, so that the LED packaging process can skip the SMT process.

Another objective of the present invention is to provide an LED packaging method, wherein a secondary lens with a light pattern is integrally formed directly at the same time, and all LEDs or LED dies on the circuit board are covered completely to achieve excellent water-resistance and anti-electrostatic effects.

To achieve the foregoing objective, the present invention provides an LED packaging method comprising the steps of:

a) preparing a circuit board, a transparent cap, and at least one LED material;

b) placing the transparent cap on the LED material, and aligning the transparent cap to a position superimposed with the circuit board; and c) forming an encapsulation layer with a light pattern on the transparent cap by an in-mold decoration injection molding process; wherein a filling port formed on a mold is aligned precisely above the LED material in the in-mold decoration injection molding process.

DESCRIPTION OF THE PREFERRED EMBODIMENTS

The technical characteristics and contents of the present invention will become apparent with the following detailed description accompanied with related drawings, and the drawings are provided for the purpose of illustrating the present invention only, but not intended for limiting the scope of the invention.

Figure 1:
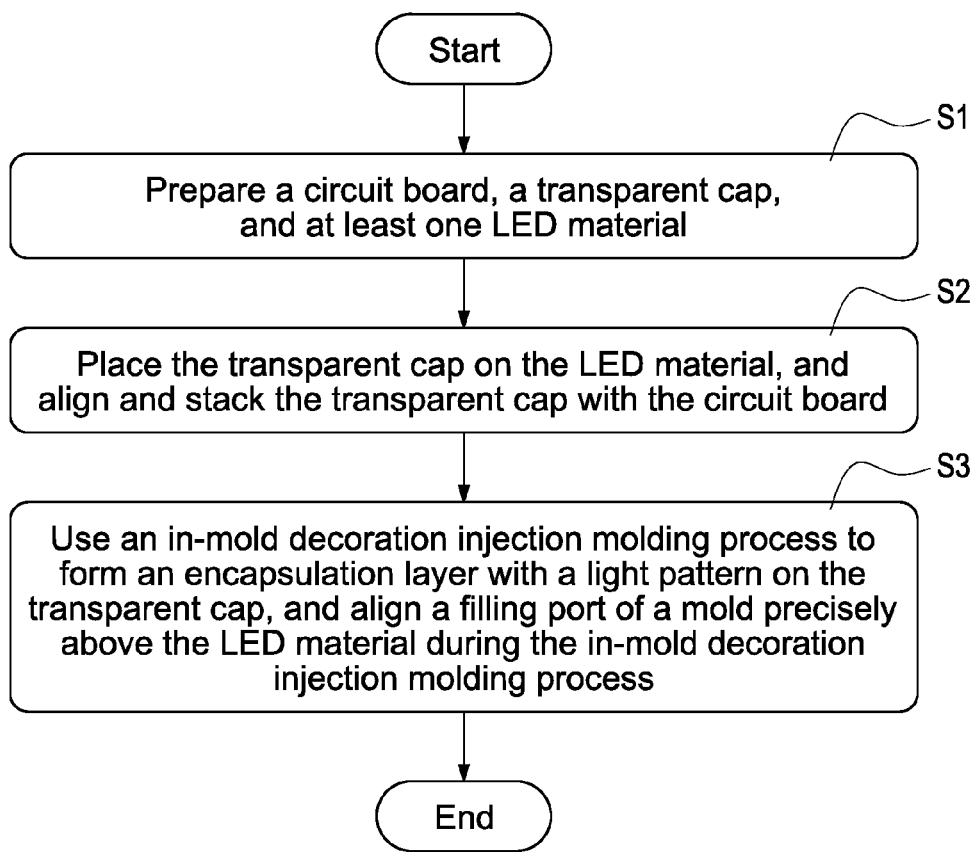
FIG. 1 is a flow chart of the present invention.
Figure 2:
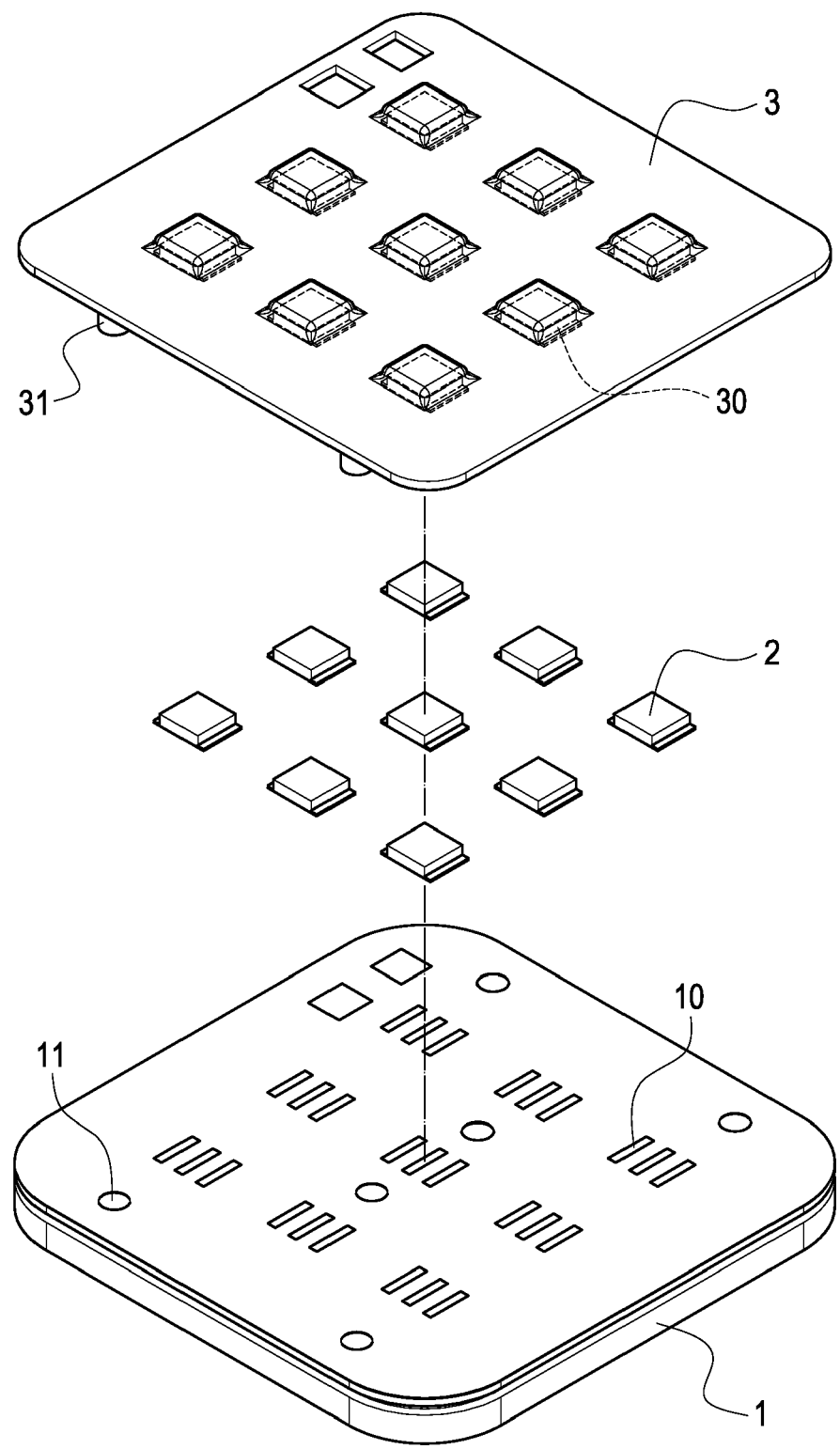
FIG. 2 is an exploded view of the present invention, showing a circuit board, a transparent cap and an LED material.

The present invention provides an LED packaging method that integrally forms a secondary lens with a light pattern directly at the same time, skips the SMT process, and reduces the poor alignment of LED or LED die on the package, and even achieves excellent water-resistance and anti-electrostatic effects without requiring additional manufacturing labor, manufacturing time and material cost. The packaging method comprises the following steps:

With reference to FIG. 1 for a step S1 together with FIG. 2, a circuit board 1, a transparent cap 3, and at least one LED material 2 are prepared, wherein the LED material 2 is an LED die that has not been packaged or an LED covered by a primary lens, and the circuit board 1 includes an electrically conductive portion 10 formed thereon in advance and provided for electrically coupling the LED material 2, and the transparent cap 3 includes a shield portion 30 formed thereon and provided for containing the LED material 2, and the transparent cap 3 is stacked with the circuit board 1, and the circuit board 1 includes an aligning hole 11 formed thereon, and the transparent cap 3 includes an aligning pillar 31 disposed thereon and protruded towards the circuit board 1. In addition, the quantity of LED materials 2 can be increased as needed, and the quantity of the shield portions 30 of the transparent cap 3 is equal to the quantity of the LED materials 2.

Figure 3:
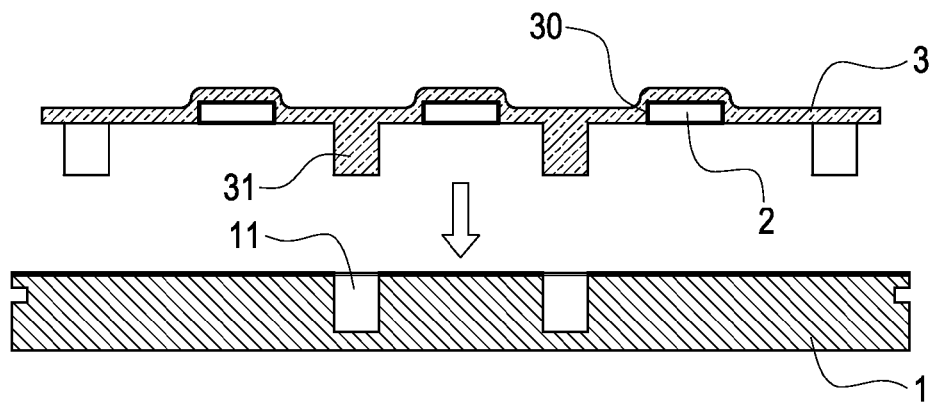
FIG. 3 is a schematic view of combining a circuit board, a transparent cap and an LED material in accordance with the present invention.
Figure 4:
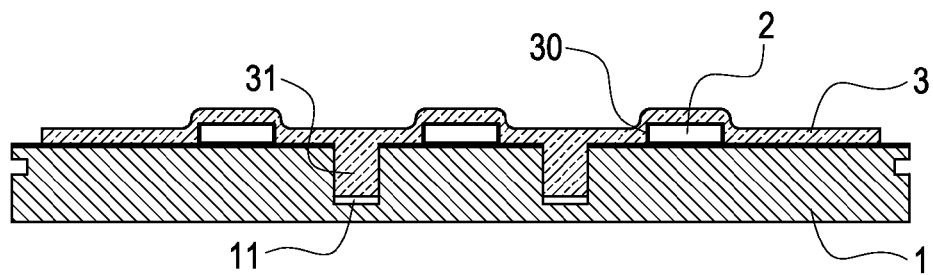
FIG. 4 is a schematic view of a circuit board, a transparent cap and an LED material combined in accordance with the present invention.

With reference to FIG. 1 for a step S2 together with FIGS. 3 and 4, the LED material 2 is placed in the shield portion 30 of the transparent cap 3, and the transparent cap 3 and the circuit board 1 are stacked with each other by passing each aligning pillar 31 into each corresponding aligning hole 11, and the LED material 2 is installed at the transparent cap 3 and the circuit board 1 and fixed to the shield portion 30 of the transparent cap 3.

Figure 5:
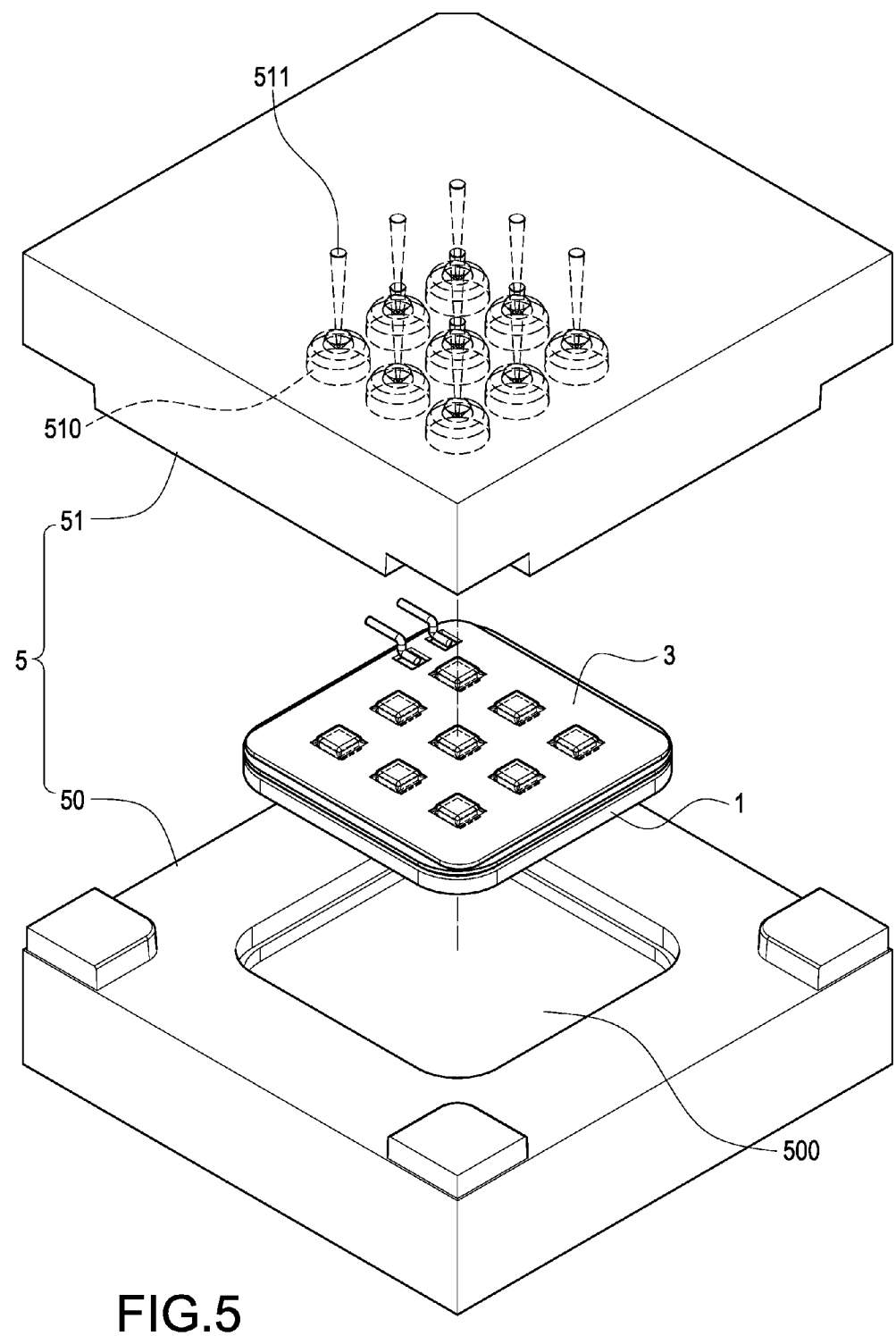
FIG. 5 is an exploded view of the present invention and a mold.
Figure 6:
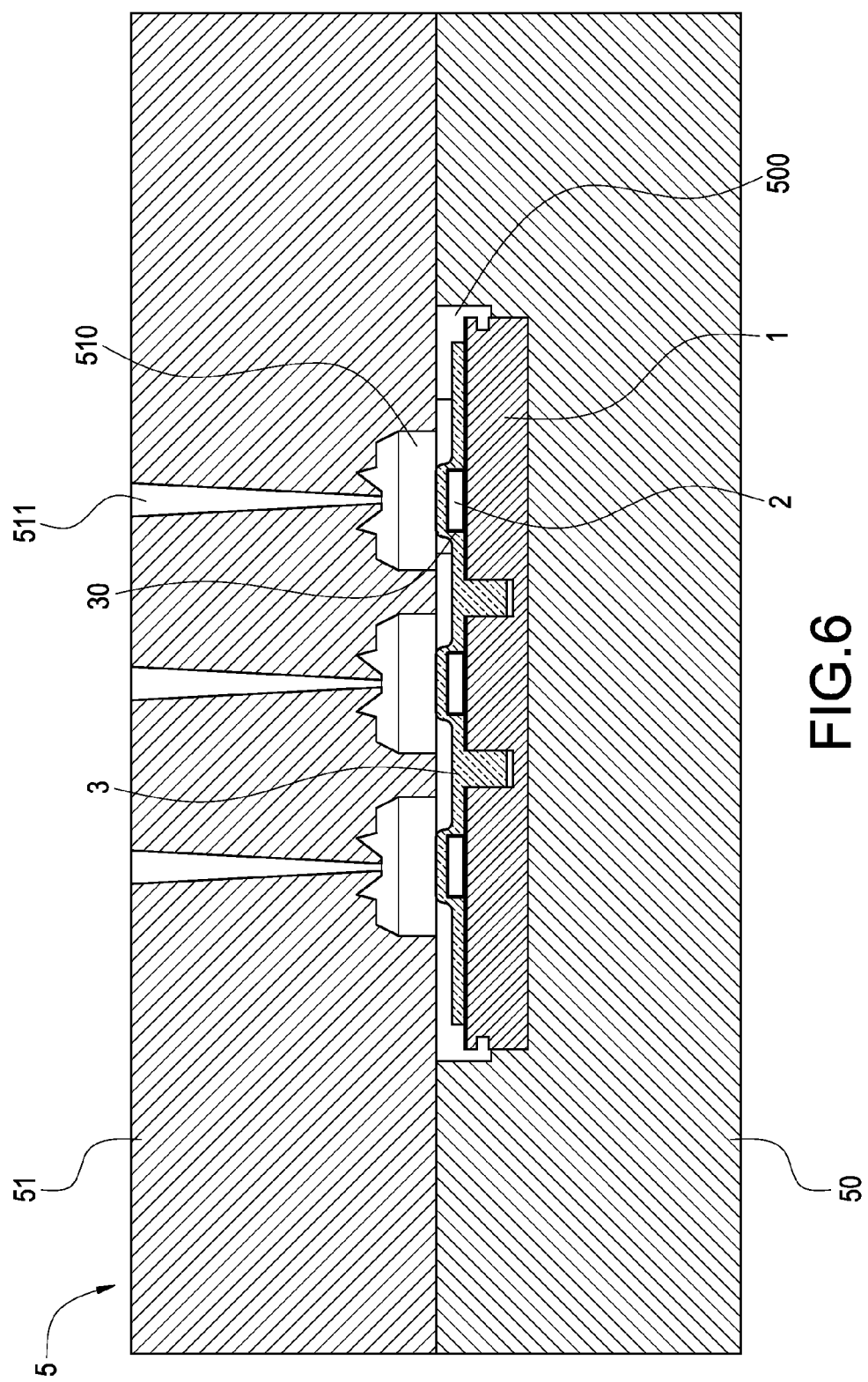
FIG. 6 is a cross-sectional view of the present invention, before an in-mold decoration injection molding process takes place.
Figure 7:
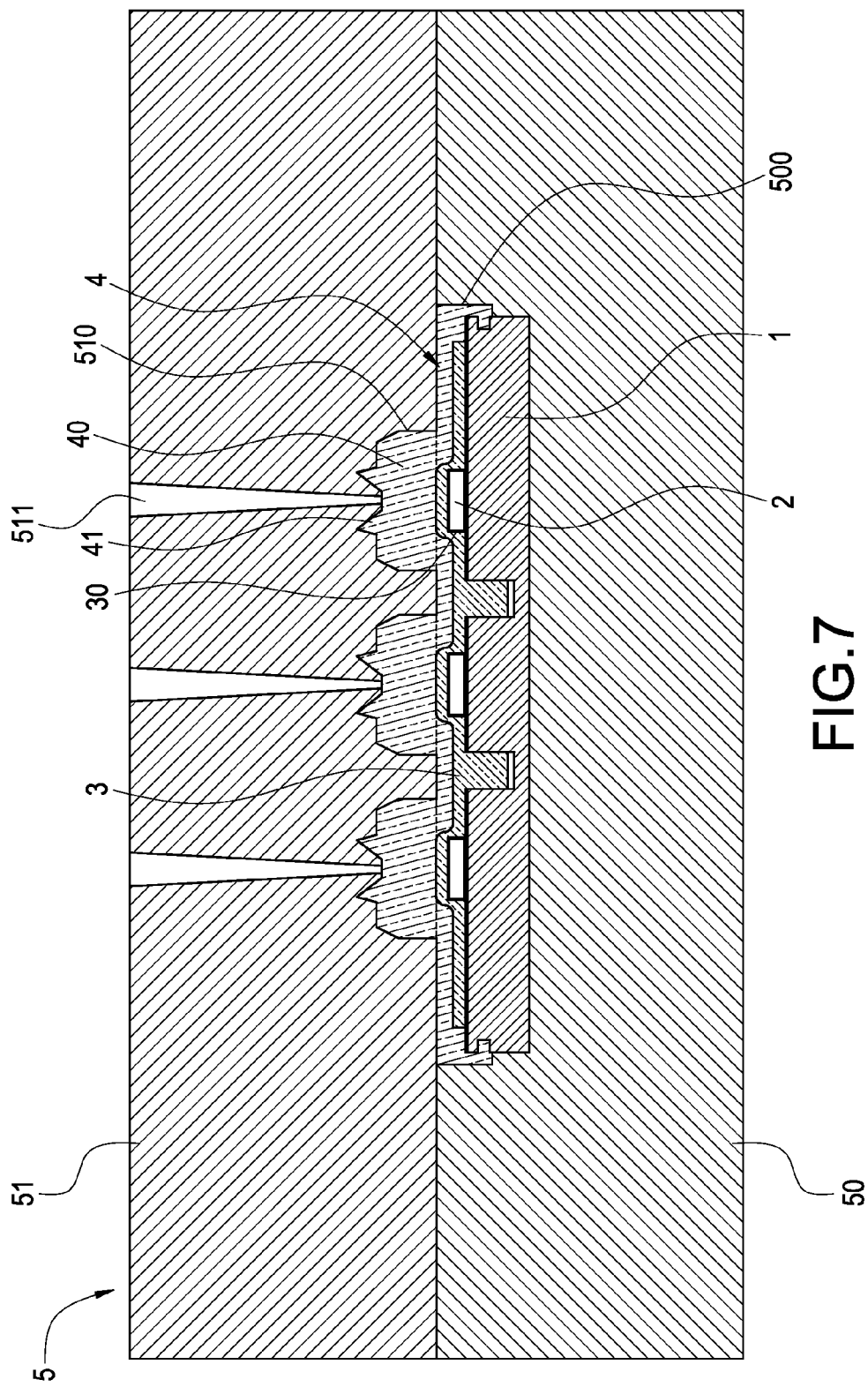
FIG. 7 is a cross-sectional view of the present invention, after an in-mold decoration injection molding process takes place.

With reference to FIG. 1 for a step S3 together with FIGS. 5 and 6, a mold 5 is prepared, and the in-mold decoration injection molding process is used for forming an encapsulation layer 4 (as shown in FIG. 7) with a light pattern on the transparent cap 3, wherein the mold 5 includes a lower mold 50 and an upper mold 51, and the lower mold 50 includes a containing space 500 concavely formed thereon and provided for installing components such as the stacked circuit board 1, and the upper mold 51 corresponding to the LED material 2 is disposed concavely and provided for forming a mold cavity 510 to the secondary lens and the light pattern, and the upper mold 51 has a filling port 511 interconnected to the mold cavity 510, and the filling port 511 is disposed precisely above the LED material 2.

In FIG. 7, after a plastic material is filled into each filling port 511, impact forces produced in the step of filling the plastic material will not deviate the LED material 2 during the in-mold decoration injection molding process, since each filling port 511 is situated above each corresponding LED material 2, and the LED material 2 is covered and protected by the transparent cap 3, so that the LED material 2 can maintain its original fixed position while performing a packaging process of the secondary lens 40. In the meantime, the light pattern portion 41 can be integrally formed on the secondary lens 40 at the same time. In addition, the SMT process can be skipped, since the issue of the deviated LED die 2 no longer exists.

Figure 8:
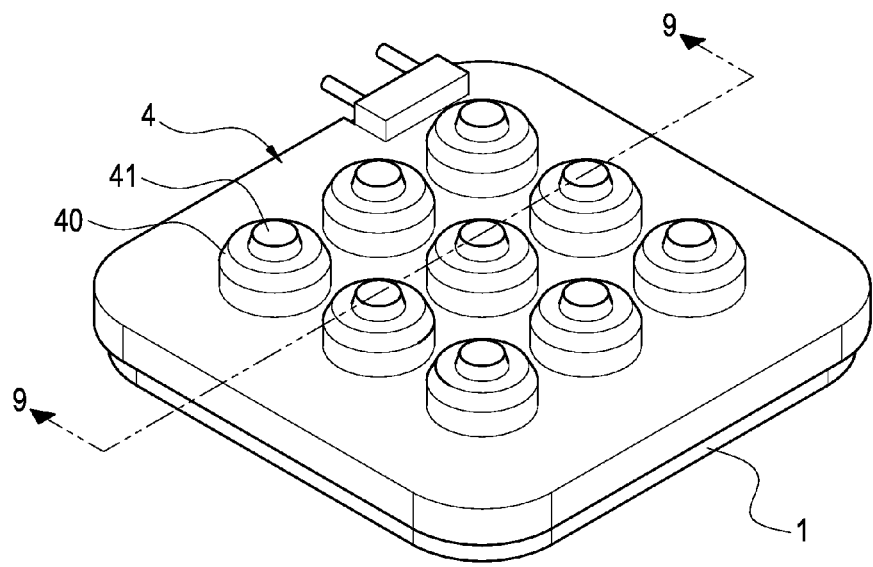
FIG. 8 is a perspective view of a finished good of the present invention.
Figure 9:
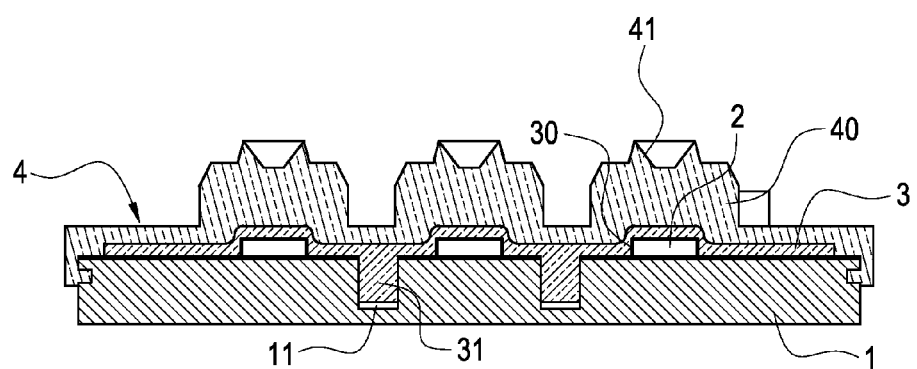
FIG. 9 is a cross-sectional view of a finished good of the present invention.

In FIGS. 8 and 9, the encapsulation layer 4 is formed by the in-mold decoration injection molding process and covered onto the transparent cap 3, such that the encapsulation layer 4 can cover all LED materials 2 installed on the circuit board 1 to achieve excellent waterproof and anti-electrostatic effects.

What is claimed is:

1. A light emitting diode (LED) packaging method, comprising the steps of:
   a) preparing a circuit board (1), a transparent cap (3), and at least one LED material (2);
   b) placing the transparent cap (3) on the LED material (2), and aligning the transparent cap (3) to a position that is superimposed with the circuit board (1); and
   c) forming an encapsulation layer (4) with a pattern on the transparent cap (3) by an in-mold decoration injection molding process;
   wherein a filling port (511) formed on a mold is aligned precisely above the LED material (2) in the in-mold decoration injection molding process,
   wherein the circuit board comprises an aligning hole (11) formed thereon, and
   wherein an aligning pillar (31) that is disposed on the transparent cap (3) protrudes towards the aligning hole (11).

2. The LED packaging method of claim 1, wherein the circuit board (1) includes an electrically conductive portion (10) provided for electrically coupling the LED material (2).

3. The LED packaging method of claim 1, wherein the LED material (2) is a part of an LED die that has not been packaged, or an LED that has been covered with a primary lens.

4. The LED packaging method of claim 1, wherein the transparent cap (3) includes a shield portion (30) formed thereon and provided for containing the LED material (2), and the quantity of the shield portions (30) is equal to the quantity of the LED materials (2).

5. The LED packaging method of claim 4, wherein the LED material (2) is disposed in the shield portion (30) of the transparent cap (3).

6. The LED packaging method of claim 1, wherein the mold (5) includes a lower mold (50) and an upper mold (51), and the upper mold (51) includes a mold cavity (510) formed concavely therein and corresponds to the LED material (2), and wherein the upper mold (51) is used to form a secondary lens with the pattern, and the filling port (511) is interconnected with the mold cavity (510).

* * * * *